(12) United States Patent  
Kameda

(10) Patent No.: US 12,158,479 B2  
(45) Date of Patent: Dec. 3, 2024

(54) ANALYSIS DEVICE

(71) Applicant: Murata Manufacturing Co., Ltd., Nagaokakyo (JP)

(72) Inventor: Eitaro Kameda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 372 days.

(21) Appl. No.: 17/557,312

(22) Filed: Dec. 21, 2021

(65) Prior Publication Data

US 2022/0113236 A1 Apr. 14, 2022

Related U.S. Application Data

(63) Continuation of application No. PCT/JP2020/010773, filed on Mar. 12, 2020.

(30) Foreign Application Priority Data

Jul. 10, 2019 (JP) .................. 2019-128182

(51) Int. Cl.
*G01N 5/00* (2006.01)
*H10N 30/20* (2023.01)

(52) U.S. Cl.
CPC ............... *G01N 5/00* (2013.01); *H10N 30/20* (2023.02)

(58) Field of Classification Search
CPC ...... G01N 5/00; G01N 29/022; G01N 29/036; G01N 29/222; G01N 2015/0046; G01N 2015/0053; G01N 2291/0426; G01N 5/02; G01N 37/00; H10N 30/20; H10N 30/082; H10N 30/2047; G01G 9/00
See application file for complete search history.

(56) References Cited

U.S. PATENT DOCUMENTS 6,326,563 B1 * 12/2001 Takeuchi ................. G01G 3/13
331/65
10,578,614 B2 3/2020 Murdock et al.
(Continued)

FOREIGN PATENT DOCUMENTS

CN 205920087 U * 2/2017
JP S61191962 A 8/1986
(Continued)

OTHER PUBLICATIONS

International Search Report issued in PCT/JP2020/010773, date of mailing Jun. 9, 2020.
(Continued)

*Primary Examiner* — Catherine T. Rastovski
*Assistant Examiner* — Drexel Alejandro Venero
(74) *Attorney, Agent, or Firm* — ArentFox Schiff LLP

(57) ABSTRACT

An analysis device that includes a piezoelectric substrate having a pair of opposing principal surfaces; a groove disposed in one of the principal surfaces of the piezoelectric substrate and that forms a flow passage through which an analysis target flows; a first electrode disposed in at least a portion of a space inside the groove; and a second electrode disposed on another of the principal surfaces of the piezoelectric substrate so as to oppose the first electrode with the piezoelectric substrate disposed therebetween. A projection projects from a bottom surface of the groove, and at least one of the first electrode and an adsorption material is provided in a region extending from the bottom surface of the groove portion to a side surface of the projection.

20 Claims, 15 Drawing Sheets

(56) References Cited

U.S. PATENT DOCUMENTS

| | | | | |
|---|---|---|---|---|
| 2004/0187580 A1* | 9/2004 | Nozaki | ............... | G01G 3/13 |
| | | | | 73/580 |
| 2006/0130578 A1* | 6/2006 | Piazza | ............ | G01C 19/5607 |
| | | | | 73/504.16 |
| 2013/0199264 A1* | 8/2013 | Seike | ............ | B03C 3/41 |
| | | | | 73/23.4 |
| 2017/0261503 A1* | 9/2017 | Murdock | ......... | H10N 30/853 |
| 2018/0297363 A1* | 10/2018 | Nakayama | ......... | B41J 2/045 |

FOREIGN PATENT DOCUMENTS

| | | | | |
|---|---|---|---|---|
| JP | S6217656 A | 1/1987 | | |
| JP | 2000180250 A | 6/2000 | | |
| JP | 2003287538 A | 10/2003 | | |
| JP | 2007057289 A | 3/2007 | | |
| JP | 2007121246 A | 5/2007 | | |
| JP | 2008151721 A | 7/2008 | | |
| JP | 2009281939 A | 12/2009 | | |
| JP | 2010066194 A | * 3/2010 | | |
| JP | 2010141939 A | * 6/2010 | ......... | H03H 9/1085 |
| JP | 2012202870 A | 10/2012 | | |
| JP | 2014529746 A | 11/2014 | | |
| JP | 2016004009 A | 12/2016 | | |
| JP | 2019509488 A | 4/2019 | | |

OTHER PUBLICATIONS

Written Opinion of the International Search Report issued in PCT/JP2020/010773, date of mailing Jun. 9, 2020.

* cited by examiner

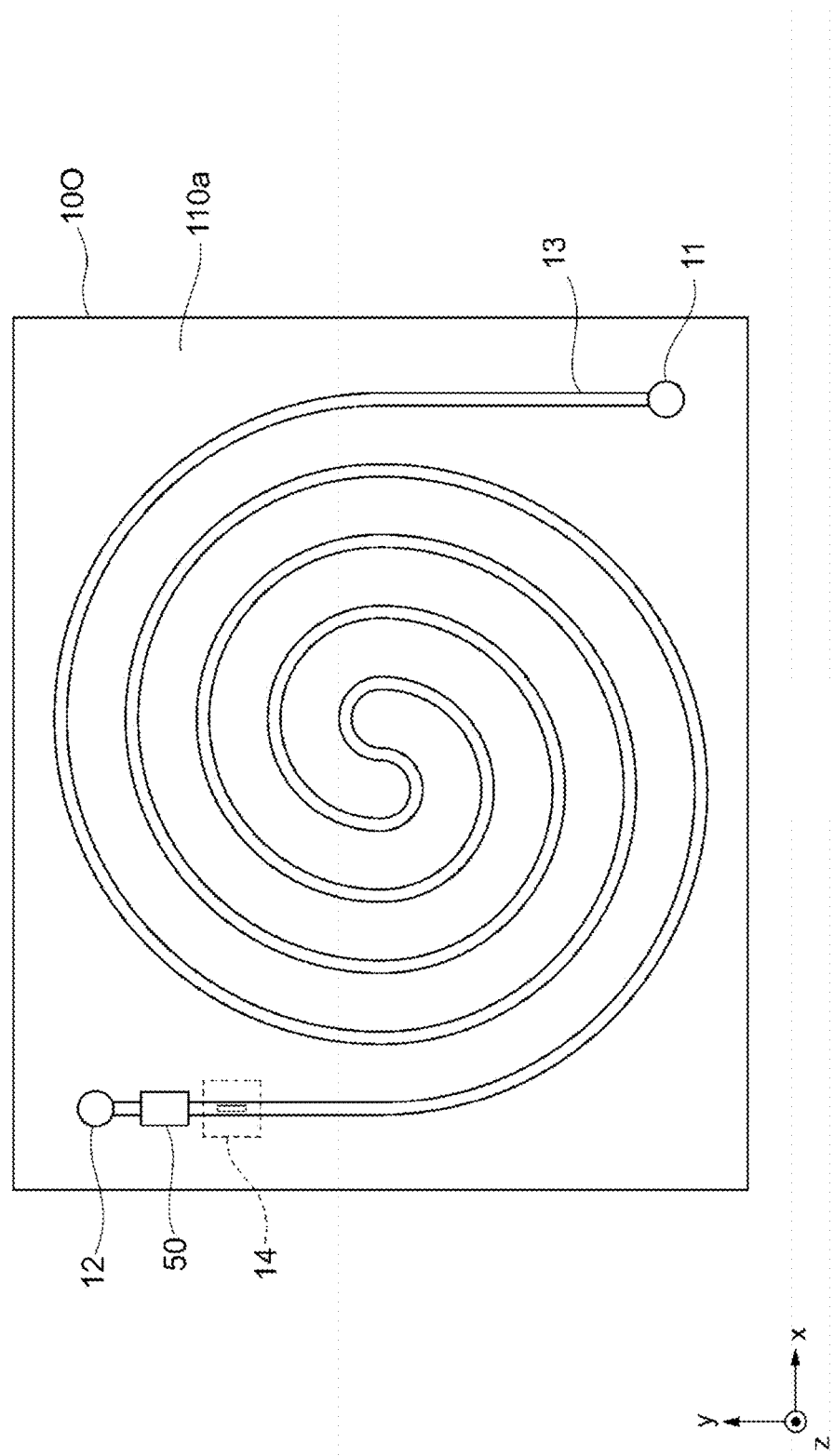

ANALYSIS DEVICE

CROSS REFERENCE TO RELATED APPLICATIONS

The present application is a continuation of PCT/JP2020/010773 filed Mar. 12, 2020, which claims priority to Japanese Patent Application No. 2019-128182, filed Jul. 10, 2019, the entire contents of each of which are incorporated herein by reference.

TECHNICAL FIELD

The present invention relates to an analysis device.

BACKGROUND

A quartz crystal microbalance ("QCM") is a known method for analyzing the mass of a target contained in liquid by utilizing the resonance of a piezoelectric vibrator, such as a quartz crystal resonator. More specifically, when a substance adheres to an electrode of a piezoelectric vibrator, the resonant frequency of the vibrator changes depending on the mass of the substance that has adhered to the electrode. The QCM is a technology for measuring the mass of a substance contained in liquid by detecting a change in the resonant frequency. For example, Japanese Unexamined Patent Application Publication No. 2007-57289 (HEREINAFTER "Patent Document 1") discloses a piezoelectric substrate having a detection electrode and an adsorption film provided at the top of a groove-shaped irregular portion formed on one surface thereof and an opposing electrode provided on the other surface thereof.

The piezoelectric substrate disclosed in Patent Document 1 has the detection electrode only at the top of the irregular portion, and therefore the area of the adsorption film provided on the detection electrode is limited. Accordingly, the amount of adsorption of a substance that serves as a measurement target may be insufficient, and a change in signal may be small.

SUMMARY OF THE INVENTION

Accordingly, it is an object of the present disclosure to provide an analysis device that enables analysis of a substance with increased precision.

Thus, an analysis device according to an exemplary embodiment of the present disclosure includes a piezoelectric substrate having a pair of principal surfaces that oppose each other; a groove portion or groove that is provided in one of the principal surfaces of the piezoelectric substrate and that forms a flow passage through which an analysis target flows; a first electrode provided in at least a portion of a space inside the groove portion; and a second electrode provided on the other of the principal surfaces of the piezoelectric substrate so as to oppose the first electrode with the piezoelectric substrate disposed therebetween. Moreover, the second electrode generating a piezoelectric vibration is between the second electrode and the first electrode. At least one projecting portion that projects from a bottom surface of the groove portion is provided inside the groove portion, and at least one of the first electrode and an adsorption material is provided in a region extending from the bottom surface of the groove portion to a side surface of the at least one projecting portion.

The exemplary embodiments of the present disclosure provides an analysis device that enables analysis of a substance with increased precision.

BRIEF DESCRIPTION OF DRAWINGS

FIG. 25 is a plan view illustrating an exemplary structure of an analysis device according to a third exemplary embodiment of the present disclosure.

DETAILED DESCRIPTION OF EMBODIMENTS

Exemplary embodiments of the present disclosure will now be described. In the following description of the drawings, the same or similar components are denoted by the same or similar reference signs. The drawings are illustrative, and schematically show the dimensions and shape of each part. It is to be understood that the technical scope of the present disclosure is not limited to the exemplary embodiments described herein.

Figure 1:
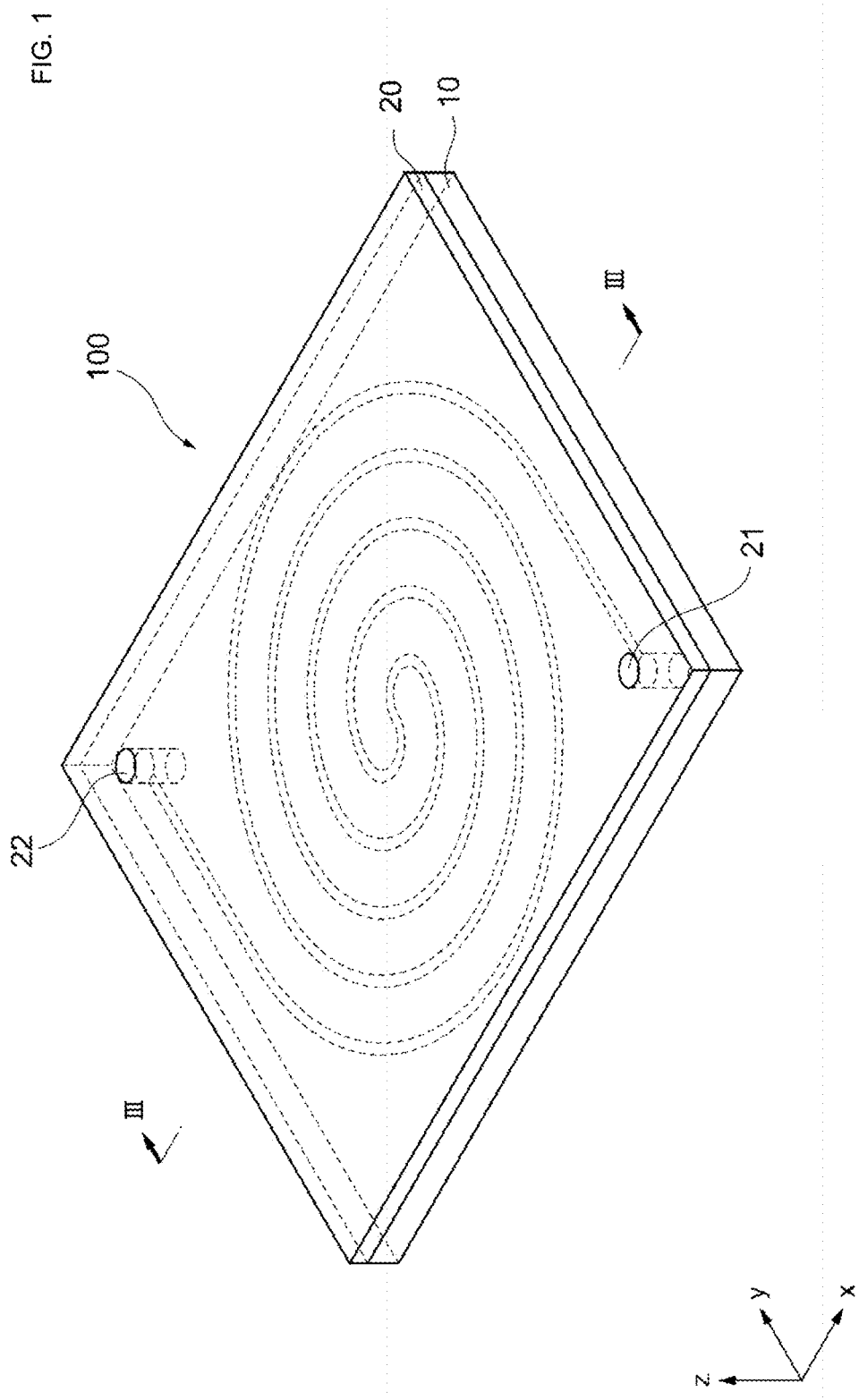
FIG. 1 is a perspective view illustrating an exemplary structure of an analysis device according to a first exemplary embodiment of the present disclosure.
Figure 2:
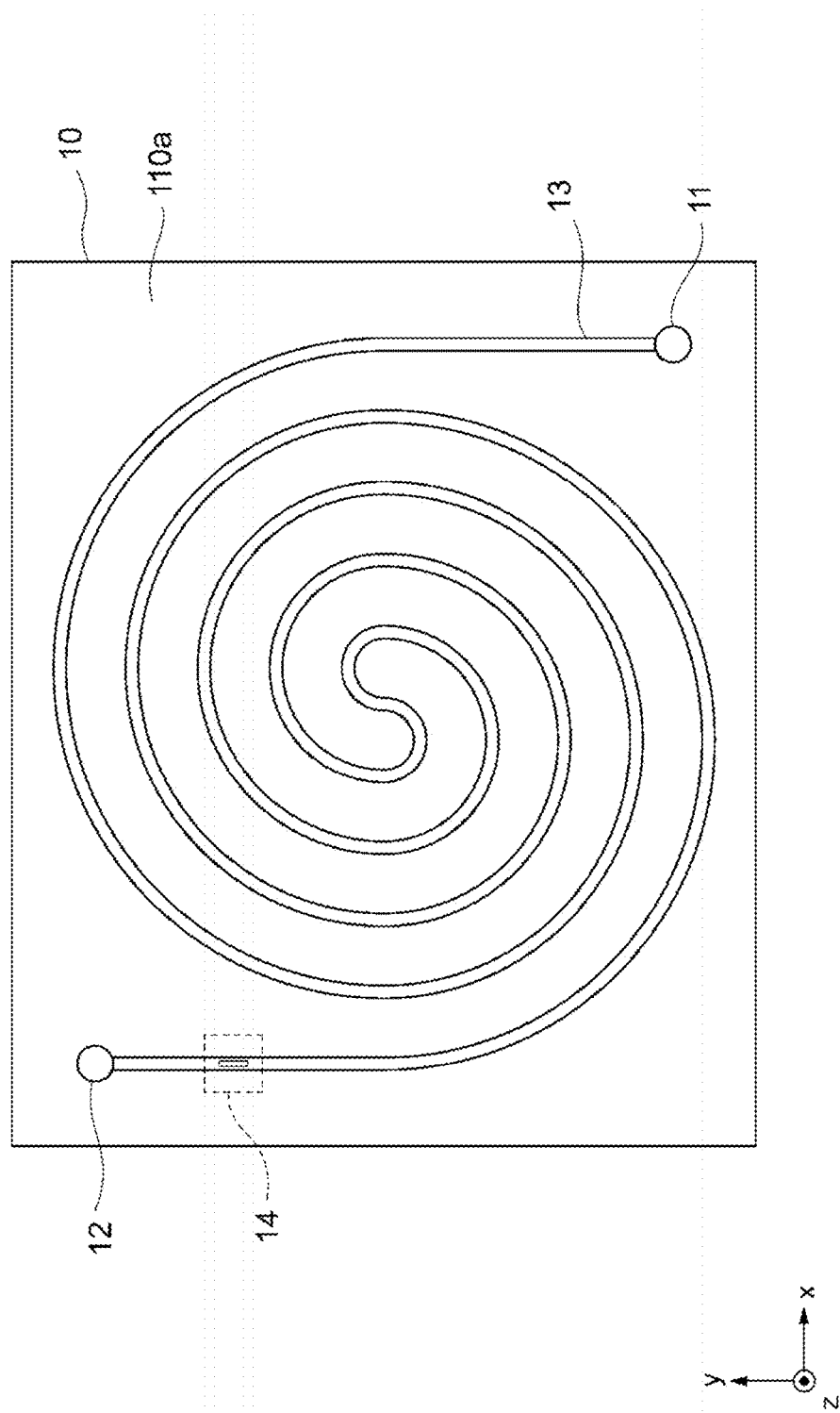
FIG. 2 is a plan view of a piezoelectric substrate illustrated in FIG. 1.
Figure 3:
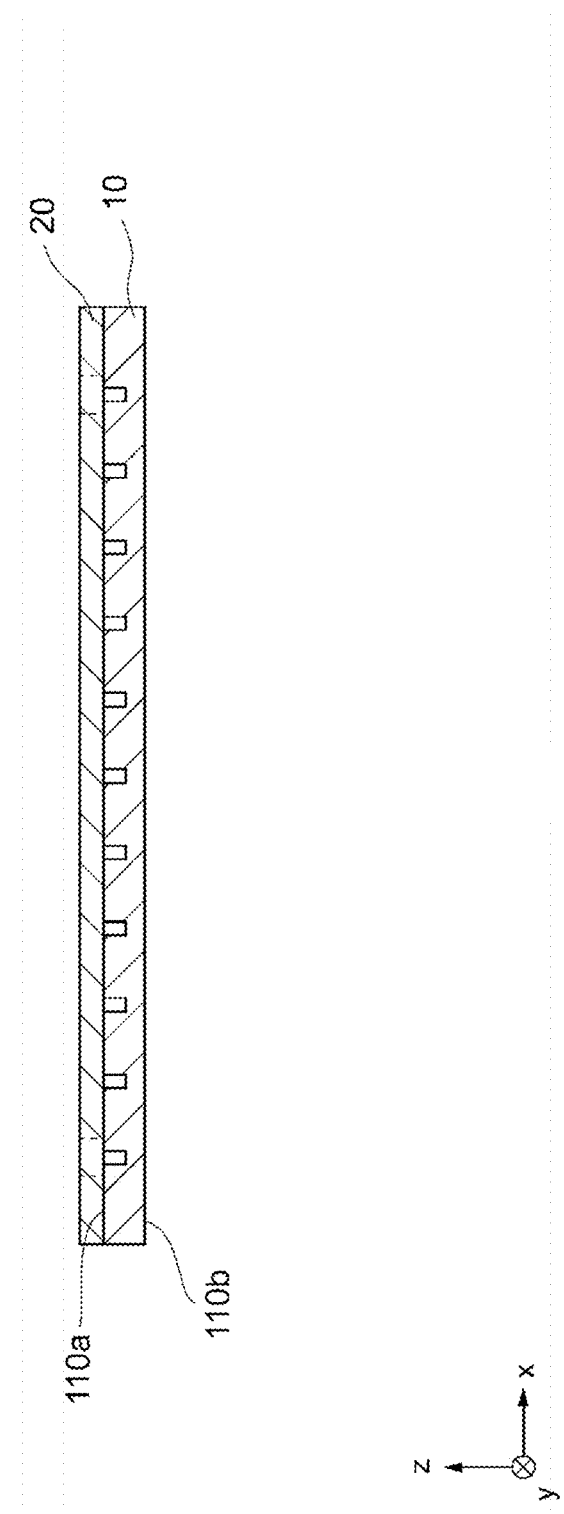
FIG. 3 is a sectional view of FIG. 1 taken along line III-III.

An analysis device according to a first exemplary embodiment of the present disclosure will be described with reference to FIGS. 1 to 3. FIG. 1 is a perspective view illustrating an exemplary structure of an analysis device according to the first embodiment of the present disclosure. FIG. 2 is a plan view of a piezoelectric substrate illustrated in FIG. 1. FIG. 3 is a sectional view of FIG. 1 taken along line III-III.

Similarly to a microsensor utilizing a quartz crystal microbalance (QCM), an analysis device 100 according to the present embodiment is configured to function as a sensor that detects a mass of a substance contained in, for example, liquid and serving as an analysis target. In the following description, an example in which liquid is introduced into the analysis device 100 will be described. However, the substance introduced into the analysis device 100 is not limited to liquid, and may instead be gas or any other fluid that is flowable.

The analysis device 100 includes, for example, a piezoelectric substrate 10 and a cover member 20. Although rectangular coordinate systems with x, y, and z axes that are orthogonal to each other will be mentioned in the following description for purposes of explaining the exemplary embodiments, these coordinate systems are no related to the crystallographic axes of members described below.

As shown, each of the piezoelectric substrate 10 and the cover member 20 is flat plate-shaped, and includes a pair of rectangular principal surfaces that are parallel to a plane defined by the x and y axes (hereinafter referred to also as an "xy plane", and other planes are similarly defined) and a thickness in a direction parallel to the z axis. The piezoelectric substrate 10 is composed of a piezoelectric member, for example, a quartz crystal substrate according to an exemplary aspect.

In the following description, as an example of the piezoelectric substrate 10, it is assumed that the piezoelectric substrate 10 is composed of an AT-cut quartz crystal substrate. For purposes of this disclosure, the AT-cut means that, when crystallographic axes of quartz crystal are X, Y, and Z axes and when Y' and Z' axes are axes obtained by rotating the Y and Z axes around the X axis in the direction from the Y axis to the Z axis by 35 degrees 15 minutes±1 minute 30 seconds, the quartz crystal substrate is cut out from synthetic quartz crystal so that principal surfaces thereof are parallel to a plane defined by the X axis and the Z' axis. The cut of the quartz crystal substrate is not limited to the AT-cut, and may instead be other cuts, such as BT-cut, for example.

As illustrated in FIGS. 2 and 3, a principal surface 110a of the piezoelectric substrate 10 that faces the cover member 20 has an inlet 11 through which the liquid is introduced, an outlet 12 through which the liquid is discharged, and a groove portion 13 that is constructed to serve as a flow passage through which the liquid flows.

The inlet 11 is provided near the corner of the principal surface 110a of the piezoelectric substrate 10 between the sides in the positive x-axis direction and the negative y-axis direction. The outlet 12 is provided near the corner of the principal surface 110a of the piezoelectric substrate 10 between the sides at the negative x-axis direction and the positive y-axis direction. Thus, the inlet 11 and the outlet 12 are provided at diagonal corners of the principal surface 110a of the piezoelectric substrate 10.

The groove portion 13 (or simply the groove) extends from the inlet 11 to the outlet 12 in a spiral shape in a plan view of the principal surface 110a of the piezoelectric substrate 10. The liquid introduced through the inlet 11 flows through the groove portion 13 toward the outlet 12. The shape of the path of the groove portion 13 is not limited to the spiral shape, and may instead be, for example, a comb shape according to an alternative aspect. A longer flow passage for the liquid causes a greater separation between substances contained in the liquid, and is therefore preferred for separation of the substance that serves as the analysis target. The structure of an adsorption region 14, which is a region in which the substance serving as the analysis target is adsorbed in the groove portion 13, will be described below.

The cover member 20 has through holes 21 and 22 located to respectively overlap the inlet 11 and the outlet 12 of the piezoelectric substrate 10 in the thickness direction. The through holes 21 and 22 extend through the cover member 20 in the thickness direction, and are respectively connected to the inlet 11 and the outlet 12 formed in the piezoelectric substrate 10. The cover member 20 may be composed of, for example, a quartz crystal substrate similarly to the piezoelectric substrate 10, and may be joined to the piezoelectric substrate 10. Thus, a sealed flow passage is formed between the piezoelectric substrate 10 and the cover member 20.

The structure of the adsorption region 14 will now be described in detail with reference to FIGS. 4 and 5.

Figure 4:
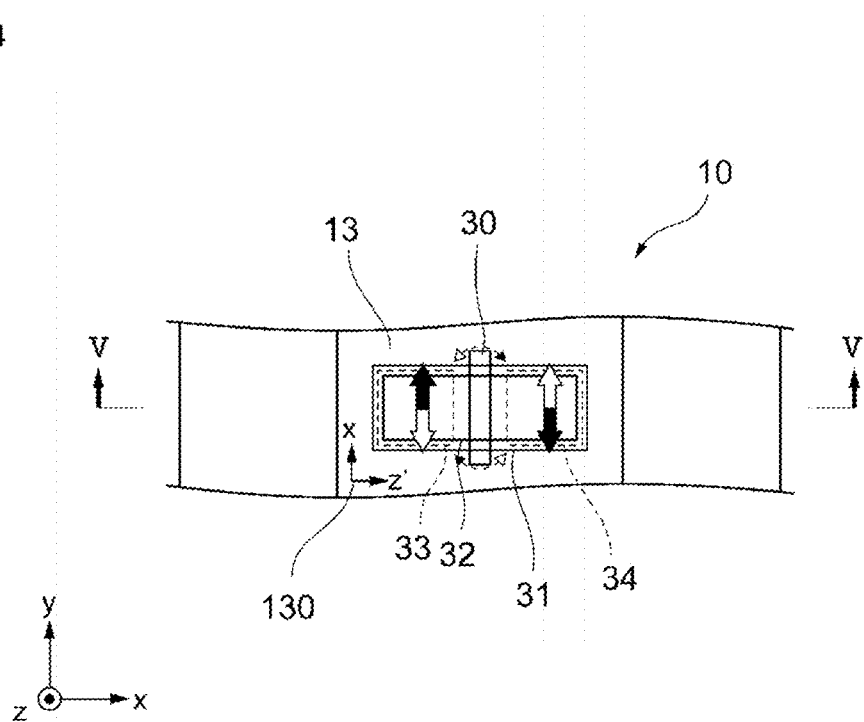
FIG. 4 is a plan view illustrating an exemplary structure of an adsorption region illustrated in FIG. 2.

FIG. 4 is a plan view illustrating an exemplary structure of the adsorption region illustrated in FIG. 2. FIG. 5 is a sectional view of FIG. 4 taken along line V-V. The plan view of FIG. 4 is viewed in the same direction as the plan view of the principal surface 110a of the piezoelectric substrate 10.

Figure 5:
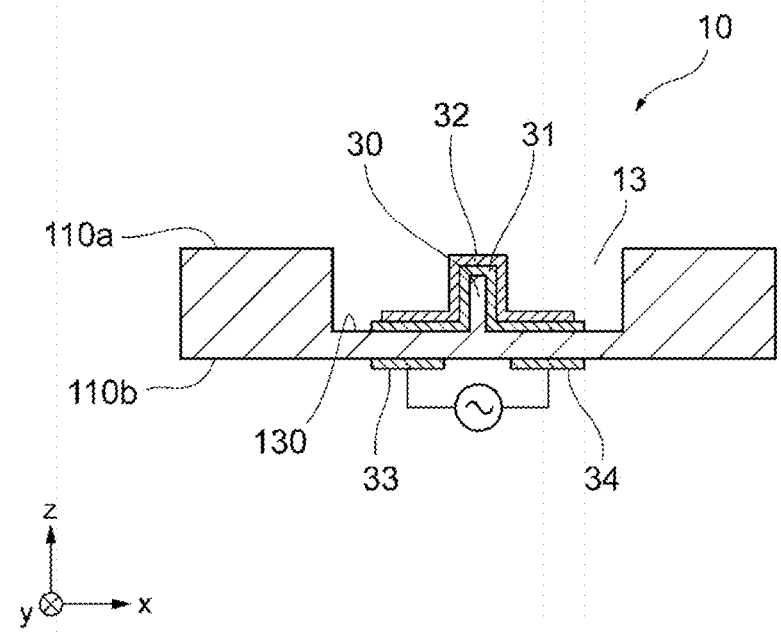
FIG. 5 is a sectional view of FIG. 4 taken along line V-V.

As illustrated in FIGS. 4 and 5, the adsorption region 14 of the piezoelectric substrate 10 includes a projecting portion 30 (also referred to as a "projection"), a ground electrode 31, an adsorption material 32, and a pair of excitation electrodes 33 and 34.

The projecting portion 30 is disposed inside the groove portion 13 and projects from a bottom surface 130 of the groove portion 13 toward the cover member 20. In the present embodiment, the projecting portion 30 is flat plate-shaped and extends in a direction in which the liquid flows (that is, the length direction of the groove portion 13). The projecting portion 30 is disposed at or near the center in a direction orthogonal to the direction in which the liquid flows (that is, the width direction of the groove portion 13). The length (height) of the projecting portion 30 in the z-axis direction is, for example, less than the length (depth) of the groove portion 13 in the z-axis direction, so that the projecting portion 30 does not protrude from the groove portion 13 in the z-axis direction. In an exemplary aspect, the projecting portion 30 can be made of, for example, the same material as that of the piezoelectric substrate 10, and can serve as a substrate projecting portion that functions as a vibrator together with the piezoelectric substrate 10. When the projecting portion 30 is made of the same material as that of the piezoelectric substrate 10, the projecting portion 30 can be, for example, formed together with the groove portion 13 of the piezoelectric substrate 10 in the process of forming the groove portion 13 by performing etching so that a portion of the piezoelectric substrate 10 is not etched. As described below, the projecting portion 30 can instead be made of a material different than that of the piezoelectric substrate 10 in an alternative aspect.

The ground electrode 31 (e.g., a first electrode) is an electrode that receives the ground potential. The ground electrode 31 is provided to cover a surface of the projecting portion 30 along the width direction of the groove portion 13. The ground electrode 31 according to the present embodiment extends from the bottom surface 130 of the groove portion 13 at one side of the projecting portion 30 to the bottom surface 130 of the groove portion 13 at the other side along a side surface of the projecting portion 30 at the one side, an upper surface of the projecting portion 30, and a side surface of the projecting portion 30 at the other side. In the exemplary aspect, it is not necessary that the ground electrode 31 cover the entire surface of the projecting portion 30 as long as the ground electrode 31 at least covers a region extending from the bottom surface 130 of the groove portion 13 to a side surface of the projecting portion 30.

The pair of excitation electrodes 33 and 34 (e.g., second electrodes) are provided on another principal surface 110b of the piezoelectric substrate 10 so as to oppose the ground electrode 31 with the piezoelectric substrate 10 disposed therebetween. The pair of excitation electrodes 33 and 34 are disposed on both sides of the projecting portion 30 in the width direction of the groove portion 13 so as not to overlap the projecting portion 30 in the plan view of the bottom surface 130. In operation, an alternating voltage is applied to each of the pair of excitation electrodes 33 and 34 so that a piezoelectric vibration in a predetermined excitation mode is generated between the ground electrode 31 and the pair of excitation electrodes 33 and 34.

For example, when the piezoelectric substrate 10 is formed such that the X axis, which is a crystallographic axis of the quartz crystal, extends in the length direction of the groove portion 13 and the Z' axis extends in the width direction of the groove portion 13, a thickness shear vibration is generated in the piezoelectric substrate 10, and the groove portion 13 vibrates in directions shown by the black and white arrows in FIG. 4. In FIG. 4, the arrows in different colors show displacements at different timings. Movements shown by the black arrows and movements shown by the white arrows alternately occur so that the thickness shear vibration is generated. This also applies to other diagrams.

As further shown, the adsorption material 32 covers at least a portion of a surface of the ground electrode 31. In the present embodiment, similarly to the ground electrode 31, the adsorption material 32 extends from the bottom surface 130 of the groove portion 13 at the one side to the bottom surface 130 of the groove portion 13 at the other side along the side surface of the projecting portion 30 at the one side, the upper surface of the projecting portion 30, the side surface of the projecting portion 30 at the other side. The adsorption material 32 may be, for example, an adsorption film that selectively adsorbs the substance that serves as the analysis target. When the adsorption material 32 adsorbs a specific substance, the excitation of the projecting portion 30 and a portion of the bottom surface 130 of the groove portion 13 around the projecting portion 30 changes, and the resonant frequency of the excitation of the piezoelectric substrate 10 changes accordingly. By detecting the change in the resonant frequency, the mass of the substance that has adhered to the adsorption material 32 can also be measured/calculated. Accordingly, the mass and concentration of the substance contained in the liquid can be measured.

The adsorption region 14 is preferably provided in the groove portion 13, which serves as the flow passage for the liquid, at a location closer to the outlet 12 than to the inlet 11. When, for example, the liquid contains a plurality of types of substances and the analysis device 100 analyzes a specific substance based on the principle of chromatography, a longer distance between the position of the adsorption material 32 and the inlet 11 provides a greater separation between the contents of the liquid as the liquid flows through the groove portion 13. Accordingly, the specific substance can be more easily adsorbed by the adsorption material 32.

In the above-described structure, the adsorption material 32 is provided not only on the bottom surface 130 of the groove portion 13, but also on the side surfaces of the projecting portion 30 in the groove portion 13 of the piezoelectric substrate 10. Accordingly, compared to a structure in which, for example, the adsorption material is provided only on the bottom surface of the groove portion, the surface area of the adsorption material is increased, so that the contact area between the liquid that flows through the groove portion 13 and the adsorption material 32 is increased. Therefore, the amount of change in the resonant frequency of the piezoelectric substrate 10 caused by adhesion of the substance to the adsorption material 32 is increased, so that the mass and concentration of the substance can be measured with higher resolution.

In the above-described structure, the projecting portion 30 is disposed such that long sides thereof are parallel to the direction in which the liquid flows. Therefore, the projecting portion 30 does not serve as a large resistance to the flow of the liquid. In addition, the projecting portion 30 is provided at or near the center of the groove portion 13 in the width direction, where the displacement of the thickness shear vibration is relatively small. Accordingly, the influence of the projecting portion 30 on the thickness shear vibration of the piezoelectric substrate 10 is reduced, so that degradation of vibration characteristics is reduced and that a high Q factor can be maintained.

According to the above-described structure, the projecting portion 30 vibrates so as to rotate in the plan view of the bottom surface 130 of the groove portion 13 (see dashed line arrows in FIG. 4) due to the vibration of the groove portion 13. Therefore, compared to a structure in which the projecting portion 30 does not vibrate, the adsorption material 32 more easily adsorbs the target substance, so that the amount of adsorption of the target substance can be increased.

According to the above-described structure, the pair of excitation electrodes 33 and 34 are both provided on the principal surface 110b of the piezoelectric substrate 10 that is outside the groove portion 13. Therefore, compared to a structure in which the pair of excitation electrodes are separately disposed inside and outside the groove portion 13 as in modifications described below or a structure in which the pair of excitation electrodes are disposed inside the groove portion, wires for applying the alternating voltage may be more easily arranged.

According to an exemplary aspect, the flow rate of the liquid, for example, may be controlled by affecting the flow of the liquid through the groove portion 13 with the shape and size of the projecting portion 30. Alternatively, the flow rate of the liquid may be measured based on a change in the resonant frequency caused when the liquid hits the projecting portion 30.

Although the projecting portion 30 is flat plate-shaped in the present embodiment, the shape of the projecting portion is not particularly limited. In addition, as described below, the arrangement position and orientation of the projecting portion 30 are also not particularly limited in alternative aspects.

It is also noted that the structure of the electrodes for generating the piezoelectric vibration of the piezoelectric substrate 10 is not limited to the above-described structure. For example, a pair of excitation electrodes may be disposed inside the groove portion, and a ground electrode may be disposed outside the groove portion (e.g., on the principal surface 110b of the piezoelectric substrate 10) so as to oppose the pair of excitation electrodes. In this case, for example, the pair of excitation electrodes may be provided on one and the other sides of the projecting portion, and each of the pair of excitation electrodes may have an adsorption material provided on a surface thereof. Moreover, the ground electrode 31 may be a floating electrode instead of receiving the ground potential.

Figure 6:
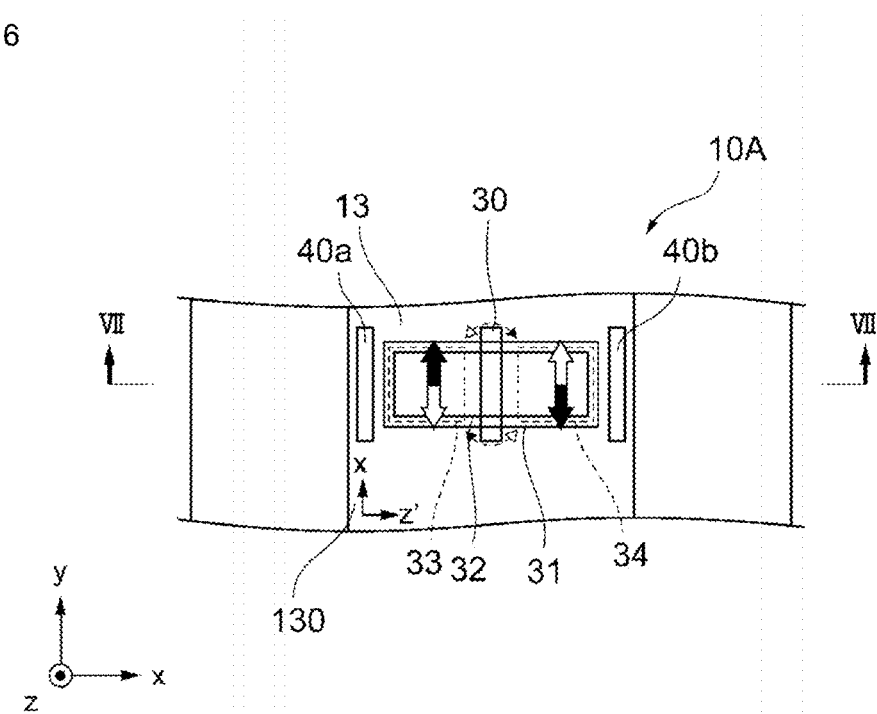
FIG. 6 is a plan view illustrating an exemplary structure of an adsorption region of an analysis device according to a first modification of the first exemplary embodiment of the present disclosure.
Figure 7:
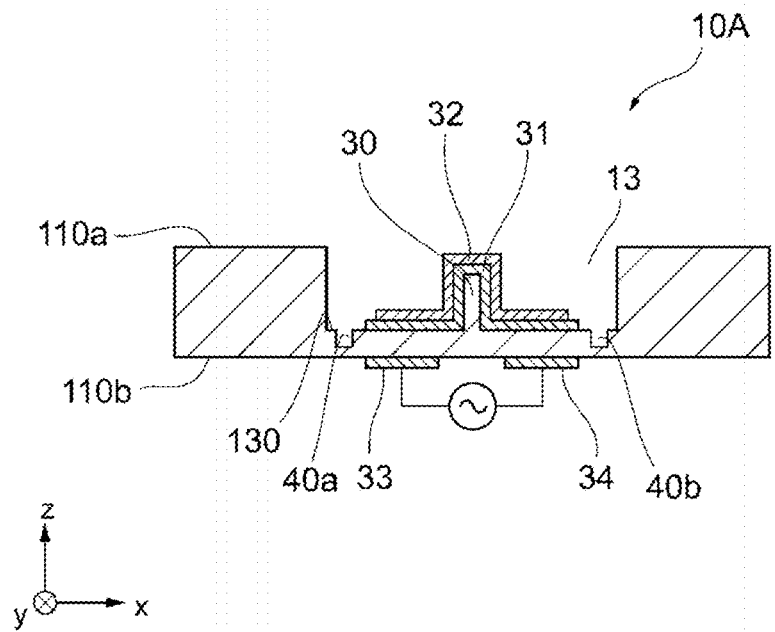
FIG. 7 is a sectional view of FIG. 6 taken along line VII-VII.

FIG. 6 is a plan view illustrating an exemplary structure of an adsorption region of an analysis device according to a first modification of the first exemplary embodiment of the present disclosure. FIG. 7 is a sectional view of FIG. 6 taken along line VII-VII. The sectional view of FIG. 6 is viewed in the same direction as the plan view of FIG. 4. This also applies to FIGS. 8, 10 to 13, 15, 17, 19, and 20 described below. In the following description, description of elements that are the same as those in the above-described embodiment is omitted, and only differences will be described. In particular, description of similar effects obtained by similar structures will not be repeated in each embodiment or modification.

As illustrated in FIGS. 6 and 7, a piezoelectric substrate 10A according to the first modification differs from the above-described piezoelectric substrate 10 in that two recesses 40a and 40b are additionally provided. As shown, the two recesses 40a and 40b are regions recessed from the bottom surface 130 of the groove portion 13 toward the principal surface 110b of the piezoelectric substrate 10A. The two recesses 40a and 40b are disposed on both sides of the projecting portion 30 in the width direction of the groove portion 13 and extend in the length direction of the groove portion 13.

Since the two recesses 40a and 40b are provided in the groove portion 13, the vibration region including the projecting portion 30 is separated from the side surfaces of the groove portion 13, and the excitation of the groove portion 13 may be easily confined to the adsorption region 14. Therefore, the substance can be analyzed with increased precision. It is also noted that the number of recesses is not limited to two. For example, a single recess may be provided at one side of the projecting portion 30 instead of the recesses on both sides of the projecting portion 30.

Figure 8:
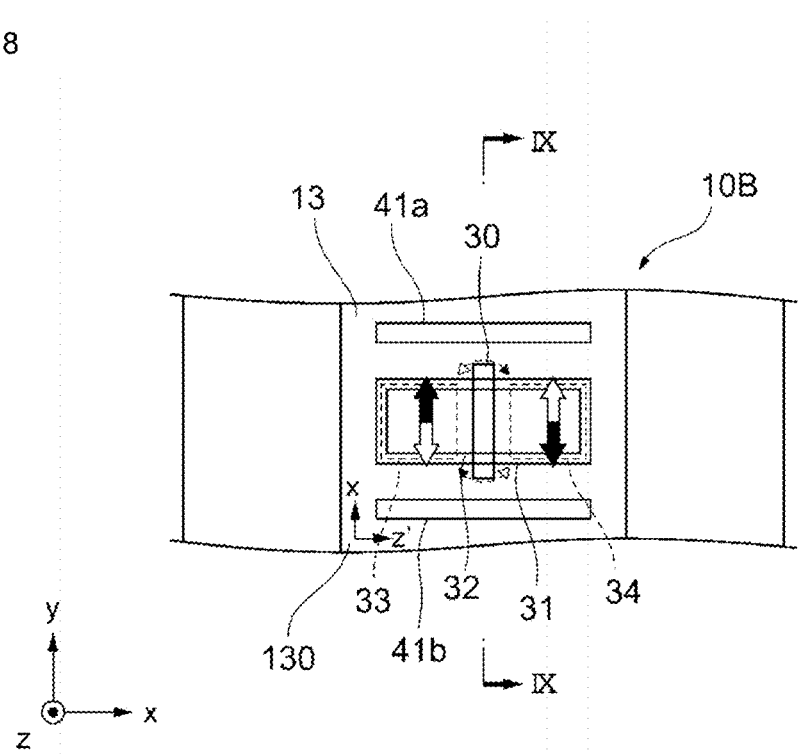
FIG. 8 is a plan view illustrating an exemplary structure of an adsorption region of an analysis device according to a second modification of the first exemplary embodiment of the present disclosure.
Figure 9:
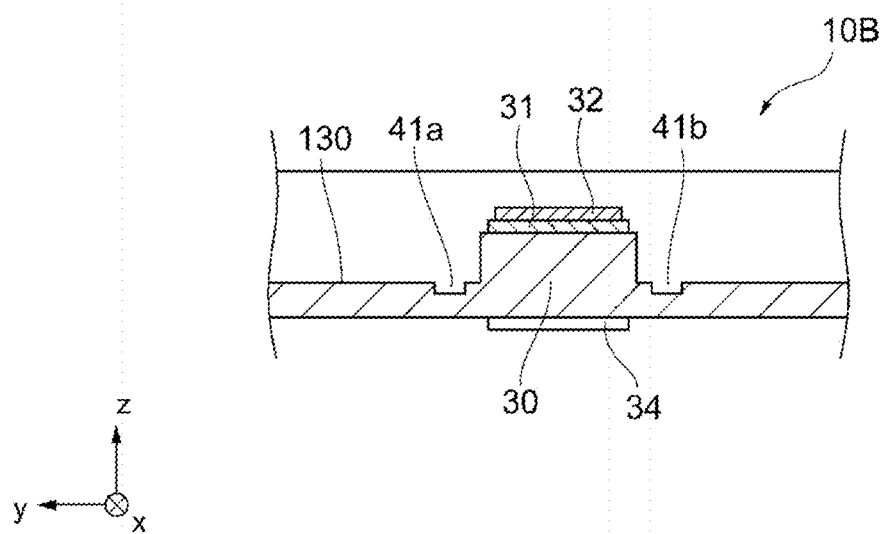
FIG. 9 is a sectional view of FIG. 8 taken along line IX-IX.

FIG. 8 is a plan view illustrating an exemplary structure of an adsorption region of an analysis device according to a second modification of the first exemplary embodiment of the present disclosure. FIG. 9 is a sectional view of FIG. 8 taken along line IX-IX.

As illustrated in FIGS. 8 and 9, a piezoelectric substrate 10B according to the second modification differs from the above-described piezoelectric substrate 10A in the positions of two recesses 41a and 41b. In the second modification, the two recesses 41a and 41b are disposed on both sides of the projecting portion 30 in the length direction of the groove portion 13 and extend in the width direction of the groove portion 13, which is orthogonal to the lengthwise direction of the projecting portion 30.

Thus, it should be appreciated that the positions of the two recesses are not particularly limited as long as the two recesses are disposed around the projecting portion 30 in the plan view of the principal surface 110a of the piezoelectric substrate 10B. Also when the two recesses 41a and 41b are disposed on both sides of the projecting portion 30 in the length direction of the groove portion 13, similarly to the piezoelectric substrate 10A, the excitation is easily confined to the adsorption region 14. Therefore, the substance can be analyzed with increased precision. In addition, it is noted that the recesses 40a and 40b and the recesses 41a and 41b may be applied in combination, and may be arranged, for example, so as to surround the entire periphery of the projecting portion 30.

Figure 10:
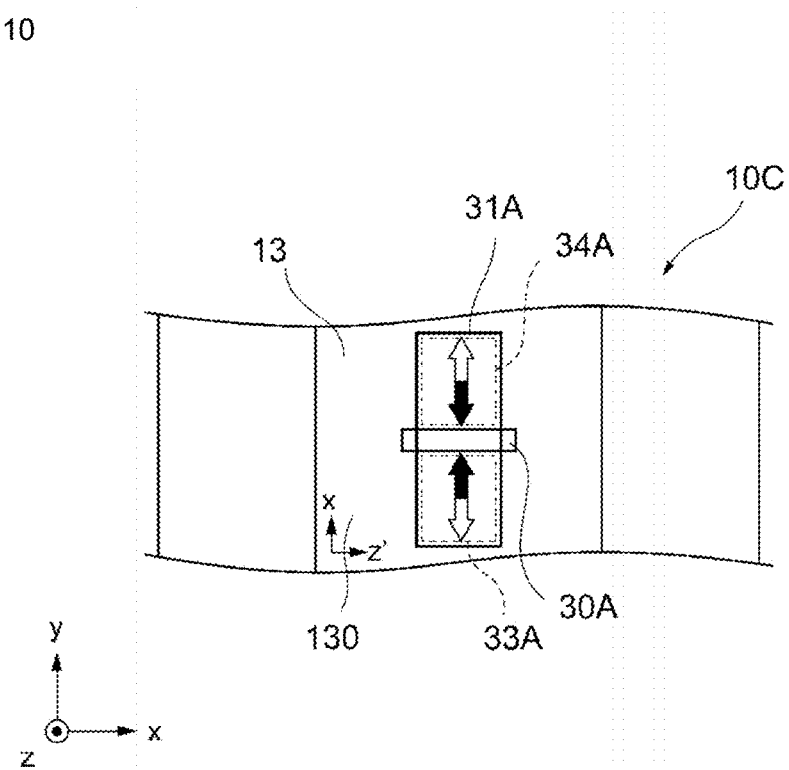
FIG. 10 is a plan view illustrating an exemplary structure of an adsorption region of an analysis device according to a third modification of the first exemplary embodiment of the present disclosure.
Figure 11:
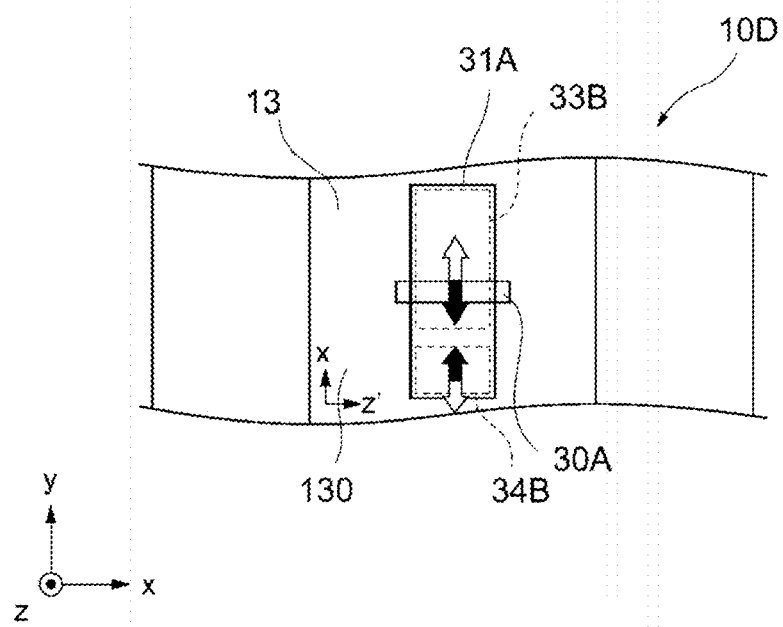
FIG. 11 is a plan view illustrating an exemplary structure of an adsorption region of an analysis device according to a fourth modification of the first exemplary embodiment of the present disclosure.
Figure 12:
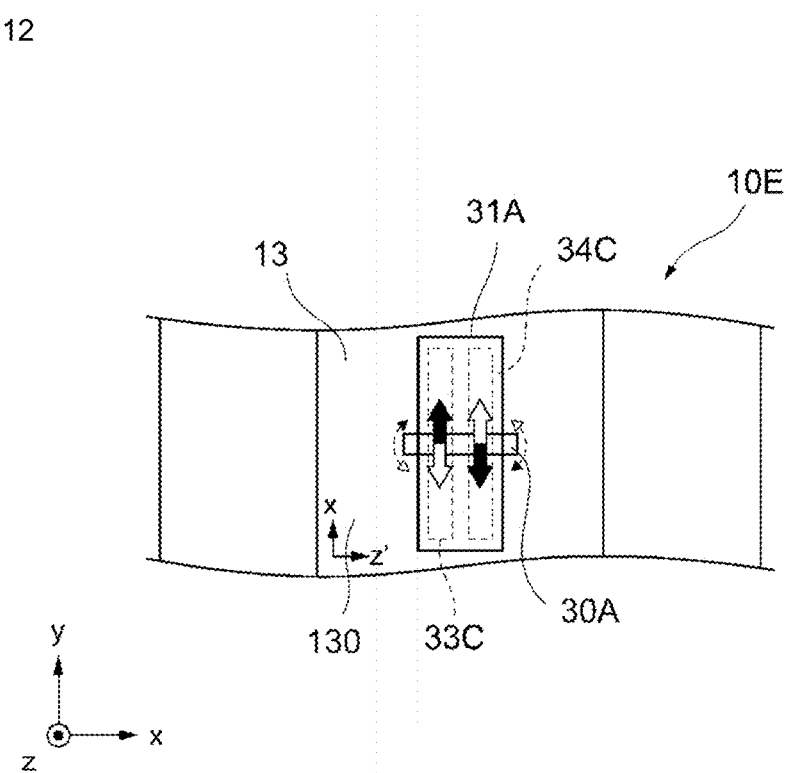
FIG. 12 is a plan view illustrating an exemplary structure of an adsorption region of an analysis device according to a fifth modification of the first exemplary embodiment of the present disclosure.

FIGS. 10 to 12 are plan views illustrating exemplary structures of adsorption regions in analysis devices according to third to fifth modifications of the first embodiment of the present disclosure. In FIG. 10 and the following figures, the adsorption material is not illustrated.

As illustrated in FIGS. 10 to 12, the third to fifth modifications differ from the first embodiment illustrated in FIG. 4 in the arrangement orientation of a projecting portion 30A. In the third to fifth modifications, the projecting portion 30A is flat plate-shaped and is disposed such that long sides thereof extend in the width direction of the groove portion 13. Accordingly, a ground electrode 31A is provided to extend in the length direction of the groove portion 13 from the bottom surface 130 of the groove portion 13 at one side of the projecting portion 30A to the bottom surface 130 at the other side along a side surface at the one side, an upper surface, and a side surface at the other side of the projecting portion 30A. The adsorption material (not illustrated) is provided to cover a surface of the ground electrode 31A.

As illustrated in FIG. 10, in the third modification, similarly to the excitation electrodes 33 and 34 illustrated in FIG. 5, a pair of excitation electrodes 33A and 34A are provided on both sides of the projecting portion 30A in regions opposing the ground electrode 31A with a piezoelectric substrate 10C disposed therebetween such that the pair of excitation electrodes 33A and 34A are symmetric about the projecting portion 30A.

In the third modification, when an alternating voltage is applied to the pair of excitation electrodes 33A and 34A, a thickness shear vibration is generated in directions shown by the black and white arrows in FIG. 10. In the present modification, since the projecting portion 30A is formed in a region where the displacement is relatively small, degradation of vibration characteristics due to the projecting portion 30A can be reduced.

As illustrated in FIG. 11, in the fourth modification, a pair of excitation electrodes 33B and 34B are provided in regions opposing the ground electrode 31A with a piezoelectric substrate 10D disposed therebetween such that the pair of excitation electrodes 33B and 34B are asymmetric about the projecting portion 30A. More specifically, one excitation electrode 33B extends over a relatively large region from one end of the ground electrode 31A to a location beyond the projecting portion 30A in the plan view of the bottom surface 130. The other excitation electrode 34B extends over a relatively narrow region from the other end of the ground electrode 31A so as not to reach the projecting portion 30A in the plan view of the bottom surface 130.

Also in the fourth modification, when an alternating voltage is applied to the pair of excitation electrodes 33B and 34B, a thickness shear vibration is generated in directions shown by the black and white arrows in FIG. 11. In the fourth modification, since the projecting portion 30A is formed in a region where the displacement is relatively large, the amount of adsorption of the target substance can be increased due to vibration of the projecting portion 30A itself. Thus, in this configuration, the pair of excitation electrodes 33B and 34B do not need to be symmetric about the projecting portion 30A.

As illustrated in FIG. 12, in the fifth modification, a pair of excitation electrodes 33C and 34C are provided in regions opposing the ground electrode 31A with a piezoelectric substrate 10E disposed therebetween such that the pair of excitation electrodes 33C and 34C extend across the projecting portion 30A in the length direction of the groove portion 13. The pair of excitation electrodes 33C and 34C are arranged next to each other in the width direction of the groove portion 13.

Also in the fifth modification, when an alternating voltage is applied to the pair of excitation electrodes 33C and 34C, a thickness shear vibration is generated in directions shown by the black and white arrows in FIG. 12. In the fifth modification, since the projecting portion 30A is formed in a region where the displacement is relatively large, the amount of adsorption of the target substance can be increased due to vibration of the projecting portion 30A itself.

In each of the third to fifth modifications, the projecting portion 30A serves as a greater resistance to the flow of the liquid compared to that in the above-described analysis device 100. Therefore, the flow rate of the liquid can be reduced.

Figure 13:
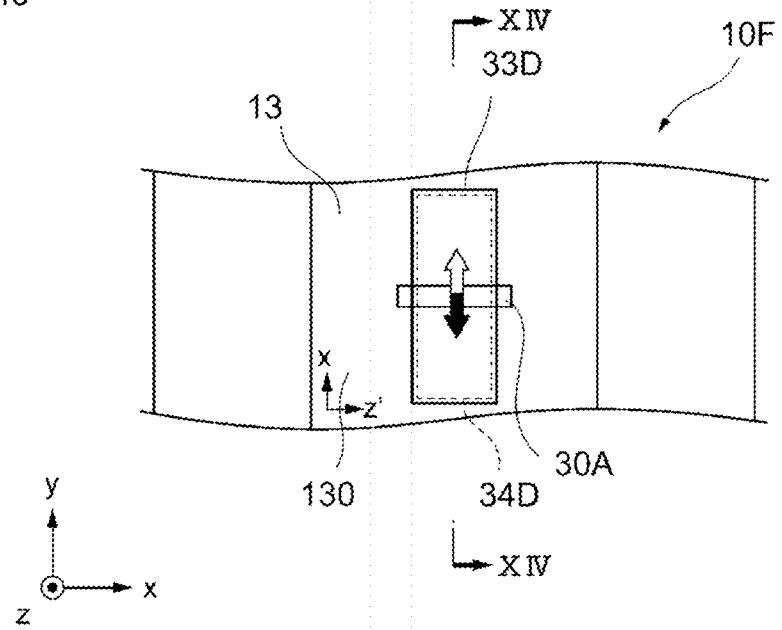
FIG. 13 is a plan view illustrating an exemplary structure of an adsorption region of an analysis device according to a sixth modification of the first exemplary embodiment of the present disclosure.
Figure 14:
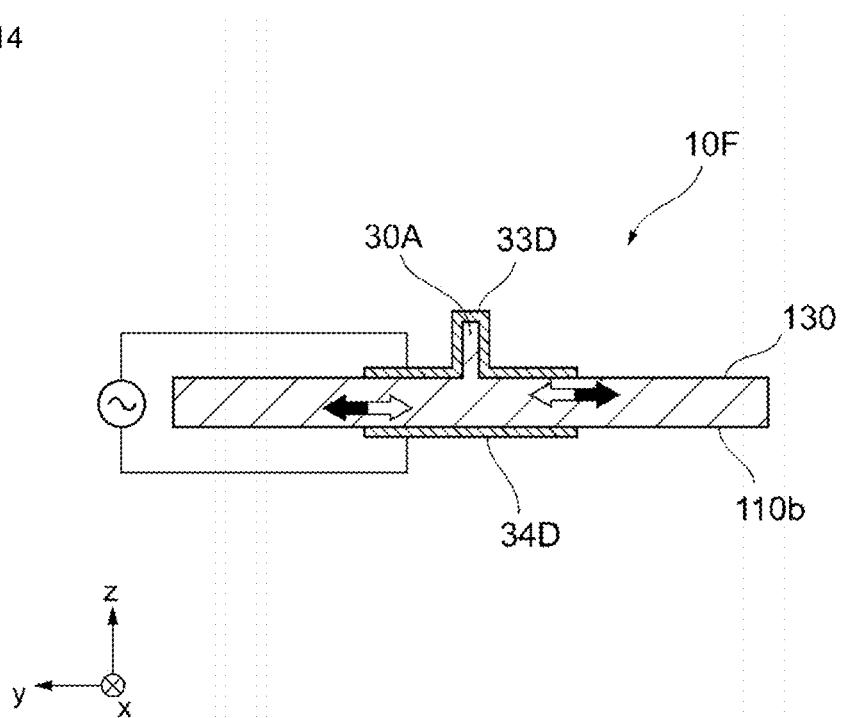
FIG. 14 is a sectional view of FIG. 13 taken along line XIV-XIV.

FIG. 13 is a plan view illustrating an exemplary structure of an adsorption region of an analysis device according to a sixth modification of the first exemplary embodiment of the present disclosure. FIG. 14 is a sectional view of FIG. 13 taken along line XIV-XIV.

The sixth modification illustrated in FIGS. 13 and 14 differs from the third modification illustrated in FIG. 10 in the structure of electrodes. In the sixth modification, the ground electrode 31A is not provided. One excitation electrode 33D (e.g., a first electrode) is provided inside the groove portion 13, and another excitation electrode 34D (e.g., a second electrode) is provided outside the groove portion 13 on the principal surface 110b of a piezoelectric substrate 10F. Similarly to the above-described ground electrode 31A, the excitation electrode 33D provided inside the groove portion 13 extends in the length direction of the groove portion 13 from the bottom surface 130 of the groove portion 13 at the one side of the projecting portion 30A to the bottom surface 130 at the other side along a side surface at one side, an upper surface, and a side surface at the other side of the projecting portion 30A. As similarly described above, the adsorption material (not illustrated) is provided to cover a surface of the excitation electrode 33D disposed inside the groove portion 13. The excitation electrode 34D is provided to oppose the excitation electrode 33D with the piezoelectric substrate 10F disposed therebetween.

Also in this structure, when an alternating voltage is applied to the pair of excitation electrodes 33D and 34D, a thickness shear vibration is generated in directions shown by the black and white arrows in FIGS. 13 and 14. In the sixth modification, since no ground electrode is provided, the number of electrodes can be reduced compared to that in each of the above-described modifications.

Figure 15:
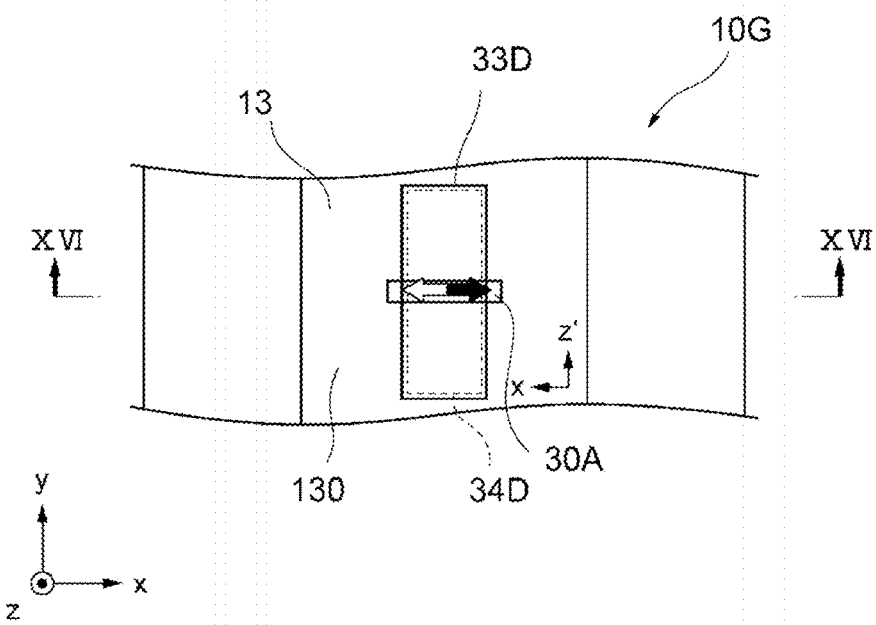
FIG. 15 is a plan view illustrating an exemplary structure of an adsorption region of an analysis device according to a seventh modification of the first exemplary embodiment of the present disclosure.
Figure 16:
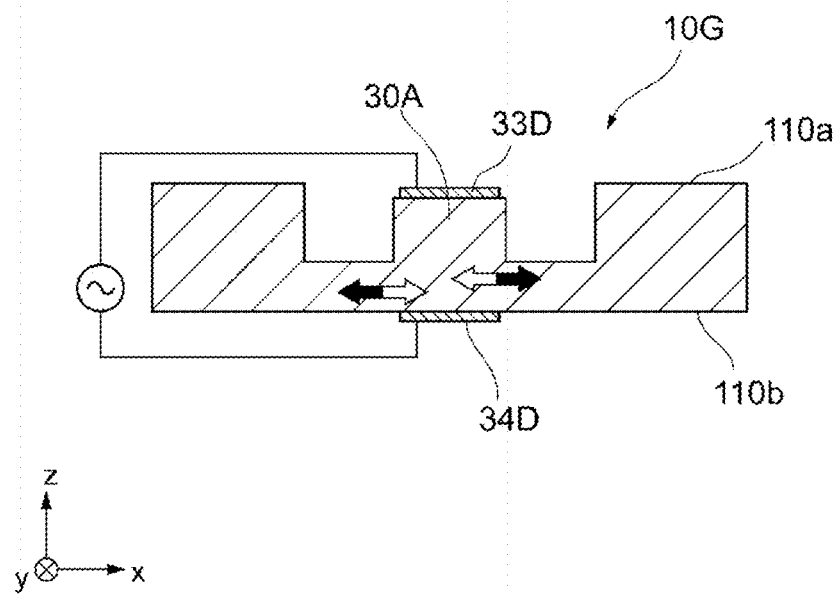
FIG. 16 is a sectional view of FIG. 15 taken along line XVI-XVI.

FIG. 15 is a plan view illustrating an exemplary structure of an adsorption region of an analysis device according to a seventh modification of the first exemplary embodiment of the present disclosure. FIG. 16 is a sectional view of FIG. 15 taken along line XVI-XVI.

The seventh modification illustrated in FIGS. 15 and 16 differs from the sixth modification illustrated in FIGS. 13 and 14 in the directions of crystallographic axes of the quartz crystal. In the seventh modification, a piezoelectric substrate 10G is disposed so that the X axis, which is a crystallographic axis of the quartz crystal, extends in the width direction of the groove portion 13 and that the Z' axis extends in the length direction of the groove portion 13. In this case, when an alternating voltage is applied to the pair of excitation electrodes 33D and 34D, a thickness shear vibration is generated in directions shown by the black and white arrows in FIGS. 15 and 16 (that is, in directions along the X axis, which is a crystallographic axis). In the seventh modification, since the projecting portion 30A vibrates in directions orthogonal to the direction in which the liquid flows, the amount of adsorption of the target substance can be increased.

Figure 17:
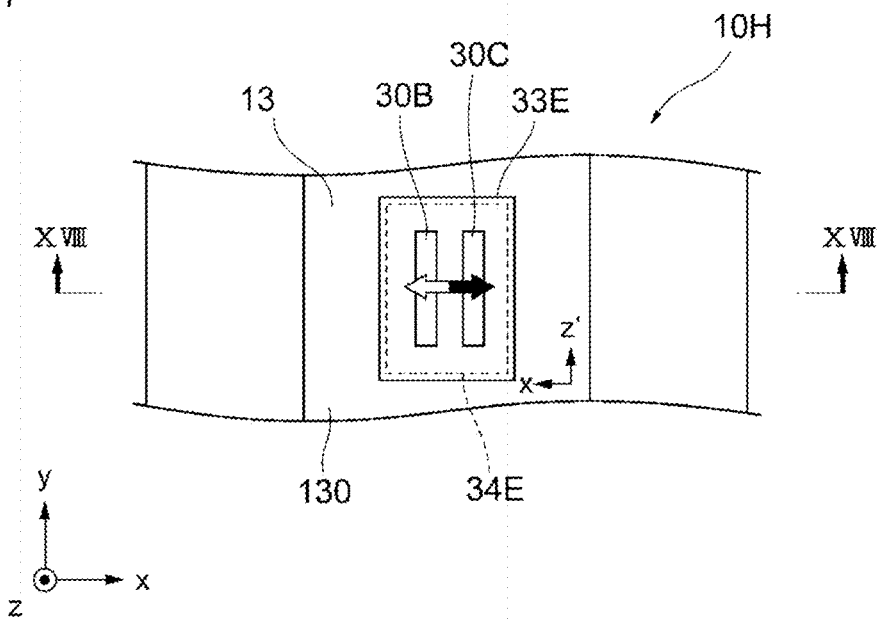
FIG. 17 is a plan view illustrating an exemplary structure of an adsorption region of an analysis device according to an eighth modification of the first exemplary embodiment of the present disclosure.
Figure 18:
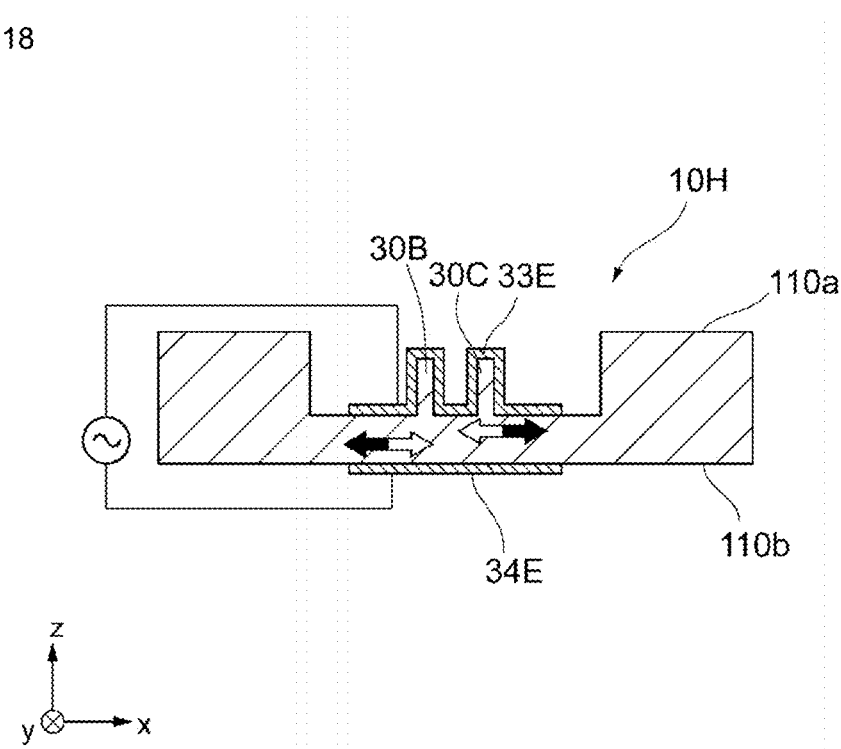
FIG. 18 is a sectional view of FIG. 17 taken along line XVIII-XVIII.

FIG. 17 is a plan view illustrating an exemplary structure of an adsorption region of an analysis device according to an eighth modification of the first exemplary embodiment of the present disclosure. FIG. 18 is a sectional view of FIG. 17 taken along line XVIII-XVIII.

As shown, the eighth modification illustrated in FIGS. 17 and 18 differs from the seventh modification illustrated in FIGS. 15 and 16 in that two projecting portions 30B and 30C are provided on a piezoelectric substrate 10H. The two projecting portions 30B and 30C are both flat plate-shaped and arranged next to each other in the width direction of the groove portion 13 so that long sides thereof extend in the length direction of the groove portion 13. An excitation electrode 33E disposed inside the groove portion 13 is provided to cover surfaces of the two projecting portions 30B and 30C. An excitation electrode 34E disposed outside the groove portion 13 is provided on the principal surface 110b of the piezoelectric substrate 10H so as to oppose the excitation electrode 33E with the piezoelectric substrate 10H disposed therebetween. When an alternating voltage is applied to the pair of excitation electrodes 33E and 34E, a thickness shear vibration is generated in directions shown by the black and white arrows in FIGS. 17 and 18.

Thus, according to various exemplary aspects, the number of projecting portions provided in the groove portion 13 is not particularly limited, and may be two of more. In the eighth modification, the long sides of the two projecting portions 30B and 30C extend in the direction of the flow of the liquid, and the projecting portions 30B and 30C vibrate in directions orthogonal to the flow of the fluid. Therefore, the influence on the flow of the fluid can be reduced, and the amount of adsorption of the target substance can be increased.

Figure 19:
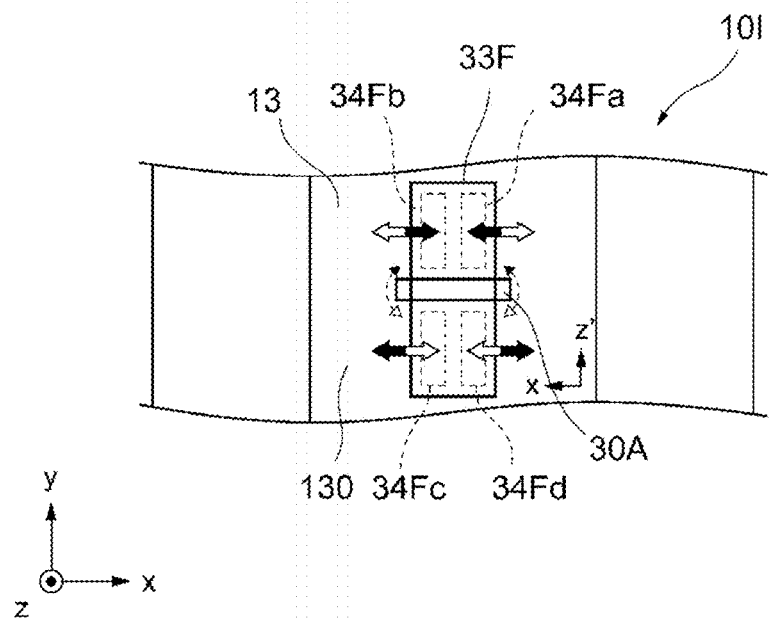
FIG. 19 is a plan view illustrating an exemplary structure of an adsorption region of an analysis device according to a ninth modification of the first exemplary embodiment of the present disclosure.

FIG. 19 is a plan view illustrating an exemplary structure of an adsorption region of an analysis device according to a ninth modification of the first exemplary embodiment of the present disclosure.

The ninth modification illustrated in FIG. 19 differs from the seventh modification illustrated in FIG. 15 in the structure of excitation electrodes provided on a piezoelectric substrate 10I. More specifically, in the ninth modification, one excitation electrode 33F is provided inside the groove portion 13, and four excitation electrodes 34Fa to 34Fd are provided outside the groove portion 13. The four excitation electrodes 34Fa to 34Fd are provided to oppose the excitation electrode 33F with the piezoelectric substrate 10I disposed therebetween, and arranged in two rows and two columns in the plan view of the bottom surface 130 as also shown.

In the ninth modification, when an alternating voltage is applied between the excitation electrode 33F and each of the four excitation electrodes 34Fa to 34Fd, a thickness shear vibration is generated in directions shown by the black and white arrows in FIG. 19. Accordingly, bending vibration of the projecting portion 30A occurs (see dashed line arrows in FIG. 19). Since the projecting portion 30A itself vibrates, the amount of adsorption of the target substance can be increased.

Thus, it should be appreciated that the number of excitation electrodes provided on the piezoelectric substrate is not particularly limited. By increasing the number of excitation electrodes, the mode of vibration of the groove portion 13 may be changed in various ways.

Figure 20:
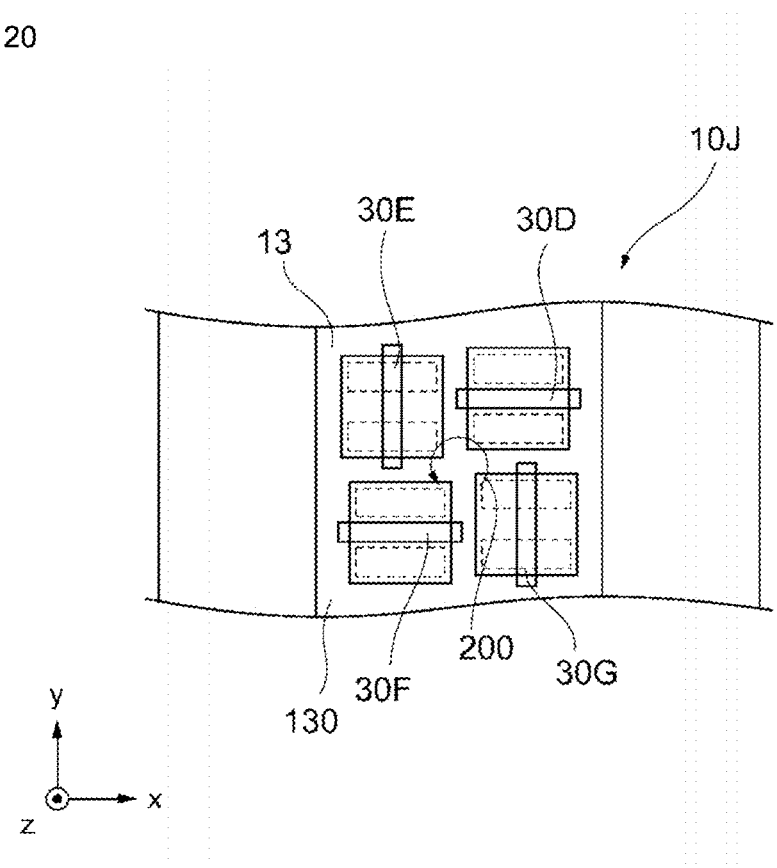
FIG. 20 is a plan view illustrating an exemplary structure of an adsorption region of an analysis device according to a tenth modification of the first exemplary embodiment of the present disclosure.

FIG. 20 is a plan view illustrating an exemplary structure of an adsorption region of an analysis device according to a tenth modification of the first exemplary embodiment of the present disclosure.

In the tenth modification illustrated in FIG. 20, four projecting portions 30D to 30G are provided on a piezoelectric substrate 10J. The four projecting portions 30D to 30G are all flat plate-shaped, and are arranged in two rows and two columns in the groove portion 13. The projecting portions 30D and 30F on one diagonal are disposed so that long sides thereof extend in the width direction of the groove portion 13. The projecting portions 30E and 30G on the other diagonal are disposed so that long sides thereof extend in the length direction of the groove portion 13. Each of the projecting portions 30D to 30G is provided with one excitation electrode disposed inside the groove portion 13 and two excitation electrodes disposed outside the groove portion 13. The arrangement of the excitation electrodes may be similar to that in any of the above-described modifications, and detailed description thereof will be omitted.

As shown by an arrow 200 in FIG. 20, a vortex is generated in a region surrounded by the four projecting portions 30D to 30G, and convection occurs in the flow of the liquid due to this configuration. Accordingly, the liquid that flows through the groove portion 13 is stirred and the substance can be easily evenly adsorbed by the adsorption material.

According to the present modification, convection occurs in the flow of the liquid, and the substance is evenly adsorbed by the adsorption material. As a result, the substance can be analyzed with increased precision. In addition, since the four projecting portions 30D to 30G are provided with the respective excitation electrodes, the flow of the fluid can be efficiently controlled by synchronizing the application of the alternating voltage or intentionally varying the timing of application of the alternating voltage. In addition, the four projecting portions 30D to 30G can be arranged in a configuration to control the flow of the liquid or measure the flow rate.

The arrangement of the excitation electrodes illustrated in FIG. 20 is an example, and the arrangements of the excitation electrodes according to the above-described various modifications may instead be applied. For example, similarly to the eighth modification illustrated in FIG. 17, all of the four projecting portions 30D to 30G may be covered with a single excitation electrode.

Figure 21:
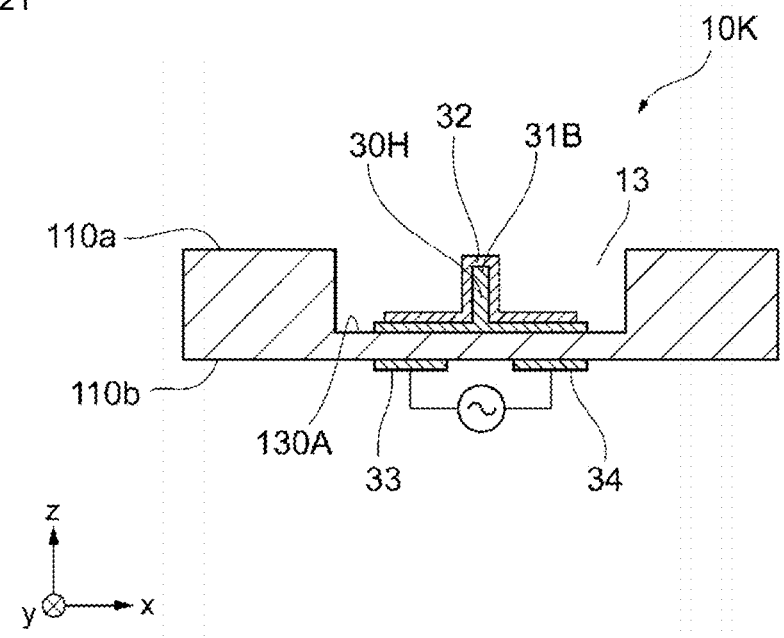
FIG. 21 is a sectional view illustrating an exemplary structure of an adsorption region of an analysis device according to an eleventh modification of the first exemplary embodiment of the present disclosure.
Figure 22:
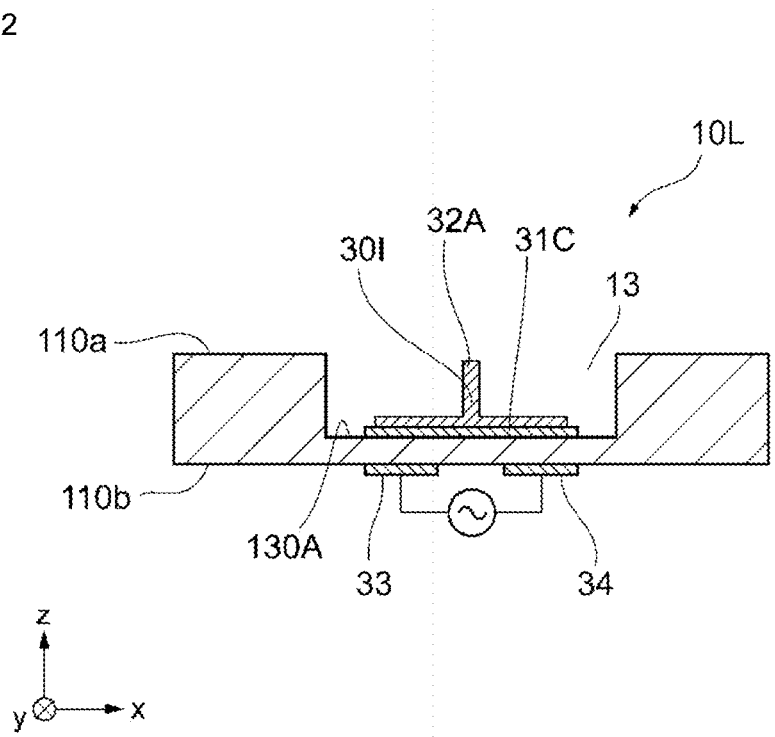
FIG. 22 is a sectional view illustrating an exemplary structure of an adsorption region of an analysis device according to a twelfth modification of the first exemplary embodiment of the present disclosure.

FIG. 21 is a sectional view illustrating an exemplary structure of an adsorption region of an analysis device according to an eleventh modification of the first exemplary embodiment of the present disclosure. FIG. 22 is a sectional view illustrating an exemplary structure of an adsorption region of an analysis device according to a twelfth modification of the first embodiment of the present disclosure. The sectional views of FIGS. 21 and 22 are viewed in the same direction as the sectional view of FIG. 5. This also applies to FIG. 23 described below.

According to the eleventh modification illustrated in FIG. 21 and the twelfth modification illustrated in FIG. 22, projecting portions 30H and 30I are made of materials different from that in the piezoelectric substrate 10 illustrated in FIG. 5. Thus, a piezoelectric substrate 10K according to the eleventh modification is formed such that the groove portion 13 has a flat bottom surface 130A and that a ground electrode 31B provided on the bottom surface 130A projects from the bottom surface 130A of the groove portion 13 to form the projecting portion 30H. As shown, the adsorption material 32 is provided on a surface of the ground electrode 31B.

A piezoelectric substrate 10L according to the twelfth modification is formed such that the bottom surface 130A of the groove portion 13 and a ground electrode 31C provided on the bottom surface 130A are flat and that an adsorption material 32A provided on the ground electrode 31C projects from the bottom surface 130A of the groove portion 13 to form the projecting portion 30I. As described in these modifications, the material of each of the projecting portions 30H and 30I that project from the bottom surface 130A of the groove portion 13 is not limited to a piezoelectric substrate, and may instead be, for example, an electrode, an adsorption material, or other materials, as should be appreciated to those skilled in the art.

Also in the above-described structures, the adsorption materials 32 and 32A are formed at least in regions extending from the bottom surface 130A of the groove portion 13 to side surfaces of the projecting portions 30H and 30I. Therefore, effects similar to those of the above-described embodiment can be obtained.

Figure 23:
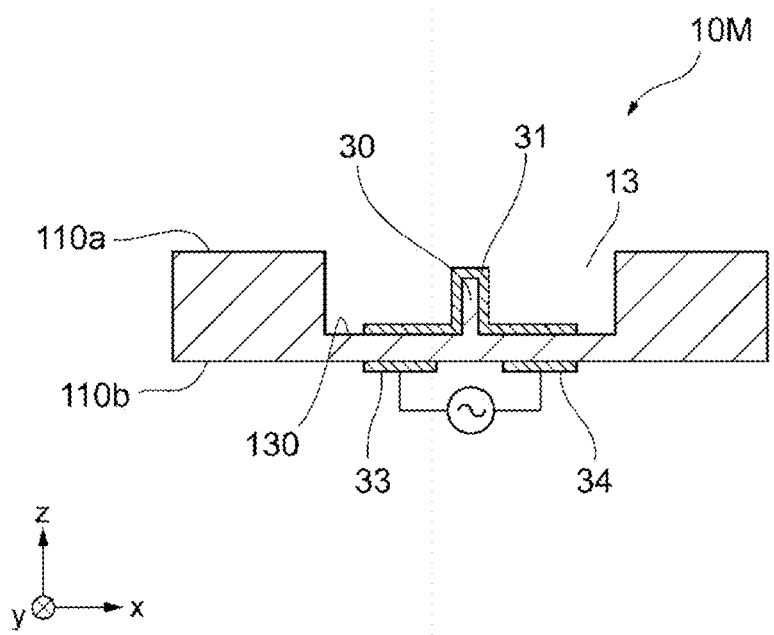
FIG. 23 is a sectional view illustrating an exemplary structure of an adsorption region of an analysis device according to a thirteenth modification of the first exemplary embodiment of the present disclosure.

FIG. 23 is a sectional view illustrating an exemplary structure of an adsorption region of an analysis device according to a thirteenth modification of the first exemplary embodiment of the present disclosure. A piezoelectric substrate 10M according to the thirteenth modification differs from the piezoelectric substrate 10 illustrated in FIG. 5 in that no adsorption material is provided on the ground electrode 31. In this embodiment, the ground electrode 31 is configured to function for the adsorbing the analysis target. Thus, at least one of the ground electrode 31 and the adsorption material can be provided in a region extending from the bottom surface 130 of the groove portion 13 to a side surface of the projecting portion 30.

Also in this structure, effects similar to those of the above-described embodiment can be obtained because the ground electrode 31 adsorbs the analysis target. Also in the above-described embodiment and modifications, the adsorption material may be omitted and the ground electrode may be configured to adsorb the analysis target.

In general, it is noted that the numbers and arrangements of the projecting portions and the numbers and arrangements of the excitation electrodes in the above-described modifications are examples, and do not form limitations. The above-described modifications may be applied in combination with each other.

Figure 24:
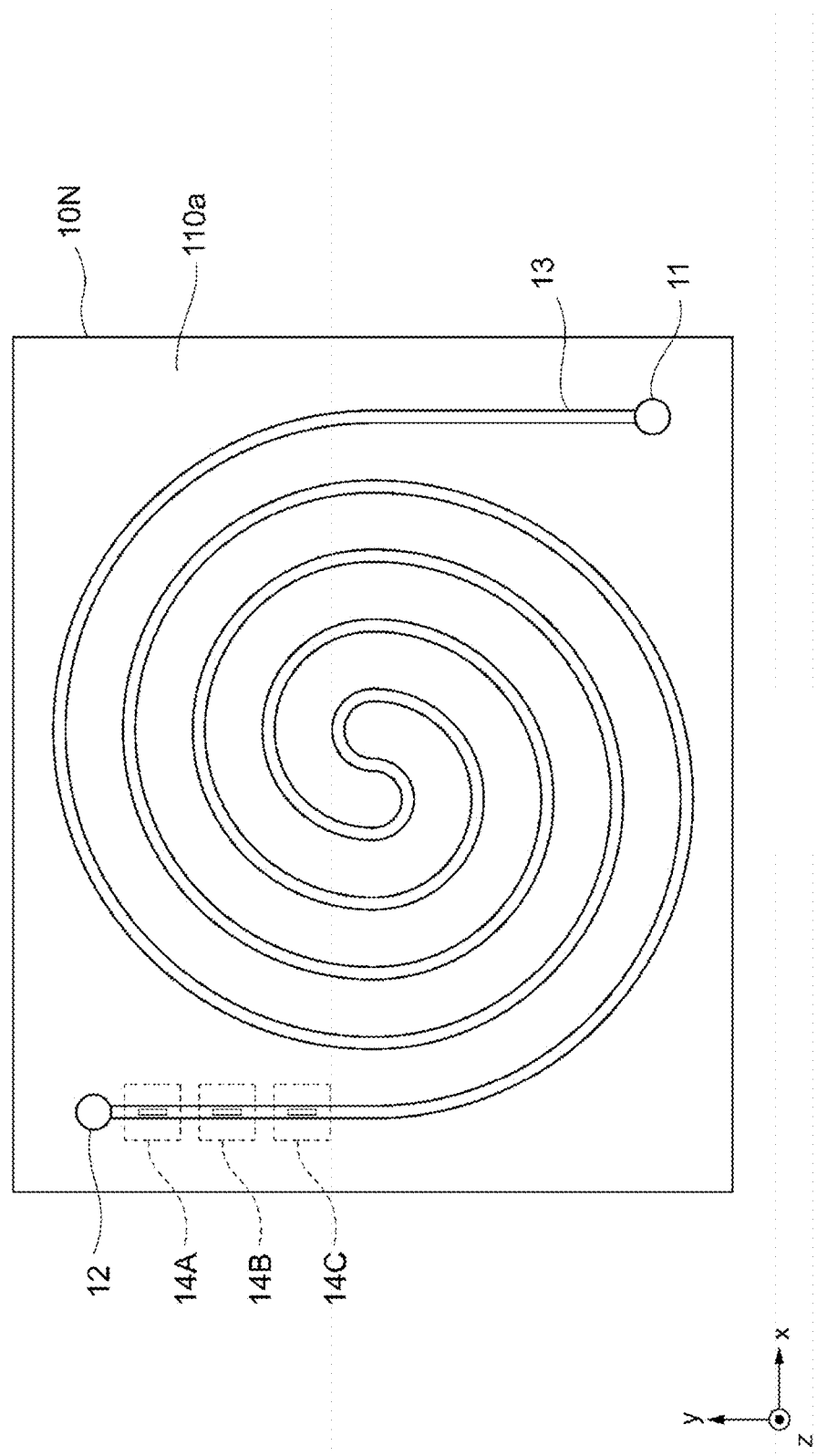
FIG. 24 is a plan view illustrating an exemplary structure of an analysis device according to a second exemplary embodiment of the present disclosure.

FIG. 24 is a plan view illustrating an exemplary structure of an analysis device according to a second exemplary embodiment of the present disclosure. The analysis device according to the present embodiment may have a cover member similar to the above-described cover member 20 included in the analysis device 100, and therefore the cover member is not illustrated. This also applies to a third embodiment described below.

As illustrated in FIG. 24, a piezoelectric substrate 10N according to present embodiment includes three adsorption regions 14A to 14C. The number of adsorption regions 14A to 14C is an example, and not provided as a limitation of the exemplary embodiment. In this aspect, the three adsorption regions 14A to 14C are disposed in the groove portion 13 and arranged next to each other in the length direction of the groove portion 13 (that is, in the direction in which the liquid flows). The structure of components, such as the projecting portion, of each of the adsorption regions 14A to 14C may be any one of those in the above-described adsorption regions, and detailed description thereof is thus omitted. The adsorption regions 14A to 14C may have either the same structure or different structures. The adsorption materials provided in the three adsorption regions 14A to 14C may, for example, selectively adsorb different substances. In such a case, the three projecting portions vibrate at different resonant frequencies, and the mass and concentration of each substance can be measured by detecting each resonant frequency.

According to the present embodiment, since different substances are adsorbed in the respective ones of the adsorption regions 14A to 14C, the masses and concentrations of a plurality of types of substances can be measured at the same time.

Similarly to, for example, the piezoelectric substrate 10B illustrated in FIGS. 8 and 9, each of the adsorption regions 14A to 14C is preferably structured such that the pair of recesses 41a and 41b are provided on both sides of the projecting portion 30 in the length direction of the groove portion 13. In such a case, the excitations of the projecting portions are strongly confined to the respective ones of the adsorption regions 14A to 14C. Therefore, interference between the vibrations of the projecting portions can be reduced. Accordingly, the substances can be analyzed with increased precision compared to when the no recesses are provided.

FIG. 25 is a plan view illustrating an exemplary structure of an analysis device according to a third exemplary embodiment of the present disclosure.

As illustrated in FIG. 25, a piezoelectric substrate 10O according to the present embodiment differs from that in the above-described analysis device 100 according to the first embodiment in that an optical analysis window 50 is additionally provided.

The optical analysis window 50 is provided at an intermediate location of the groove portion 13 that is configured to form the flow passage for the liquid. In the present embodiment, the optical analysis window 50 is disposed near the outlet 12 of the groove portion 13. The optical analysis window 50 is an analysis window that transmits light in the thickness direction of the piezoelectric substrate 10, and is disposed such that an optical analyzer can be attached thereto.

Since the optical analysis window 50 is provided at an intermediate location of the flow passage, the analysis device 100 further has an optical analysis function. When, for example, the optical analysis window 50 is composed of quartz crystal, various substances can be analyzed because quartz crystal allows transmission of light with a relatively wide wavelength range, and is even capable of transmitting, for example, a deep ultraviolet ray with a wavelength of about 152 nm.

Exemplary embodiments of the present invention have been described. The above-described embodiments are intended to facilitate understanding of the present invention, and not to limit interpretation of the present invention. The present invention may be modified or improved without departing from the gist thereof, and includes equivalents to the present invention. In other words, the present invention includes the embodiments to which a person skilled in the art has made a design change as appropriate as long as they have characteristics of the present invention. For example, the elements included in the embodiments and arrangements, materials, conditions, shapes, sizes, etc., thereof are not limited to the illustrated examples, and may be changed as appropriate. The elements of the embodiments may be applied in combinations with each other as long as such combinations are technically possible, and the combinations thereof are also included in the scope of the present invention as long as they have characteristics of the present invention.

REFERENCE SIGNS LIST 10, 10A to 10O piezoelectric substrate, 11 inlet, 12 outlet, 13 groove portion, 14, 14A to 14C adsorption region, 20 cover member, 21, 22 through hole, 30, 30A to 30I projecting portion, 31, 31A to 31C ground electrode, 32, 32A adsorption material, 33, 33A to 33F, 34, 34A to 34E, 34Fa to 34Fd excitation electrode, 40a, 40b, 41a, 41b recess, 50 optical analysis window, 100 analysis device, 110a, 110b principal surface, 130, 130A bottom surface

The invention claimed is:

1. An analysis device comprising:
a piezoelectric substrate having a pair of principal surfaces that oppose each other;
a groove disposed in a first principal surface of the pair of principal surfaces and that is configured as a flow passage through which an analysis target flows;
a first electrode disposed in at least a portion of a space inside the groove;
a second electrode disposed on a second principal surface of the pair of principal surfaces so as to oppose the first electrode with the piezoelectric substrate disposed therebetween; and
at least one projection disposed inside the groove and that projects from a bottom surface of the groove,
wherein at least an adsorption material is disposed in a region extending from the bottom surface of the groove to a side surface of the at least one projection, and
wherein the adsorption material is configured to adsorb a substance serving as the analysis target, which causes a change in a resonant frequency of an excitation of the piezoelectric substrate that is used to measure a mass and a concentration of the substance.

2. The analysis device according to claim 1, wherein the second electrode is configured to generate a piezoelectric vibration between the first and second electrodes.

3. The analysis device according to claim 1, wherein the at least one projection is disposed closer to an outlet than to an inlet of the groove for the analysis target.

4. The analysis device according to claim 1, wherein the at least one projection comprises a plurality of projections disposed inside the groove and arranged in a lengthwise direction of the groove.

5. The analysis device according to claim 4, wherein one of the plurality of projections is constructed to adsorb a substance different from a substance adsorbed by another one of the plurality of projections.

6. The analysis device according to claim 1, wherein the piezoelectric substrate further has at least one recess disposed inside the groove in a region around the at least one projection and that is recessed from the bottom surface of the groove towards the second principal surface of the piezoelectric substrate.

7. The analysis device according to claim 6, wherein the at least one recess comprises a pair of recesses disposed on each side of the at least one projection portion in a lengthwise direction of the groove.

8. The analysis device according to claim 1, wherein the groove is arranged in a spiral shape in a plan view of the pair of principal surfaces of the piezoelectric substrate.

9. The analysis device according to claim 1, wherein the at least one projection includes a substrate projection comprising a material that is a same material as the piezoelectric substrate and that projects from the bottom surface of the groove.

10. The analysis device according to claim 9, wherein the first electrode is disposed in a region extending from the bottom surface of the groove to a side surface of the substrate projection.

11. The analysis device according to claim 1, wherein the at least one projection comprises the first electrode projecting from the bottom surface of the groove.

12. The analysis device according to claim 11, wherein the adsorption material is disposed at least on a portion of a surface of the first electrode.

13. The analysis device according to claim 1, wherein the at least one projection comprises the adsorption material projecting from the bottom surface of the groove.

14. The analysis device according to claim 2, wherein the second electrode generates the piezoelectric vibration between the first and second electrodes in a thickness shear vibration mode.

15. The analysis device according to claim 1, wherein the at least one projection comprises the first electrode with the adsorption material disposed on the first electrode.

16. The analysis device according to claim 15, wherein the adsorption material extends from the first electrode and is disposed above the bottom surface of the groove.

17. The analysis device according to claim 1, wherein the at least one projection comprises a plurality of projections constructed to generate a vortex for the analysis target flow.

18. The analysis device according to claim 1, wherein the first electrode is a pair of excitation electrodes and the second electrode is a ground electrode that at least partially overlaps the pair of excitation electrodes in a thickness direction of the piezoelectric substrate.

19. The analysis device according to claim 1, wherein the at least one projection extends in a lengthwise direction of the groove relative to the flow passage through which the analysis target flows, and the at least one projection is disposed at a center of the groove in a width direction of the groove.

20. An analysis device comprising:
- a piezoelectric substrate having a pair of principal surfaces that oppose each other;
- a groove disposed in a first principal surface of the pair of principal surfaces and that is configured as a flow passage through which an analysis target flows;
- a first electrode disposed in at least a portion of a space inside the groove;
- a second electrode disposed on a second principal surface of the pair of principal surfaces so as to oppose the first electrode with the piezoelectric substrate disposed therebetween; and
- at least one projection disposed inside the groove and that projects from a bottom surface of the groove,
- wherein at least one of the first electrode and an adsorption material is disposed in a region extending from the bottom surface of the groove to a side surface of the at least one projection, and
- wherein the first electrode is a ground electrode and the second electrode is a pair of excitation electrodes that at least partially overlaps the ground electrode in a thickness direction of the piezoelectric substrate.

* * * * *